United States Patent [19]
Gariboldi et al.

[11] Patent Number: 5,376,832
[45] Date of Patent: Dec. 27, 1994

[54] MOS HALF-BRIDGE DRIVE CIRCUIT, PARTICULARLY FOR POWER MOS HALF-BRIDGES

[75] Inventors: Roberto Gariboldi, Lacchiarella; Marcello Leone, Milan, both of Italy

[73] Assignee: SGS-Thomson Microelectronics S.r.l., Agrate Brianza, Italy

[21] Appl. No.: 29,691

[22] Filed: Mar. 11, 1993

[30] Foreign Application Priority Data

Mar. 12, 1992 [EP] European Pat. Off. ......... 92830119.1

[51] Int. Cl.$^5$ .................. H03L 5/00; H03K 17/687
[52] U.S. Cl. .................. 327/108; 365/226; 327/306; 327/427; 327/530
[58] Field of Search ............... 307/296.1, 296.2, 296.4, 307/264, 261, 246, 578, 571, 482, 296.6; 365/226

[56] References Cited

U.S. PATENT DOCUMENTS

| | | | |
|---|---|---|---|
| 4,896,297 | 1/1990 | Miyatake et al. | 307/578 |
| 4,906,056 | 3/1990 | Taniguchi | 307/578 |
| 4,980,576 | 12/1990 | Rossi et al. | 307/246 |
| 5,258,662 | 11/1993 | Skovmand | 307/246 |
| 5,267,201 | 11/1993 | Foss et al. | 365/226 |
| 5,268,871 | 12/1993 | Dhong et al. | 307/296.1 |

OTHER PUBLICATIONS

Seimens Components, vol. 21, No. 2, Apr. 1986, Berlin, DE, pp. 66–88, Brad Hall, "P-Channel Functions with N-Channel Fets".
Electronic Engineering, vol. 61, No. 745, Jan. 1989, London, UK, Brian Taylor et al., "The IR8200 Monolithic DMOS H-Bridge Power Control IC", pp. 43–44, 47–48.

Primary Examiner—Timothy P. Callahan
Assistant Examiner—Toan Tran
Attorney, Agent, or Firm—Wolf, Greenfield & Sacks

[57] ABSTRACT

A drive circuit includes a voltage source supplying a reference voltage at its output; a voltage elevating circuit connected to a supply voltage and to the output of the voltage source, and supplying at its output, under normal operating conditions, a drive voltage greater than the supply voltage and increasing with the reference voltage. The input of the voltage source is connected to the output of the voltage elevating circuit, and defines a positive feedback path resulting in an increase in the reference voltage corresponding to an increase in the drive voltage, and therefore results in a corresponding increase in the drive voltage up to a maximum permissible value, thus providing for a sufficient drive voltage for driving the gate-source junction of power MOS transistors, even in the presence of a low supply voltage.

30 Claims, 3 Drawing Sheets

MOS HALF-BRIDGE DRIVE CIRCUIT, PARTICULARLY FOR POWER MOS HALF-BRIDGES

BACKGROUND OF THE INVENTION

1. Field of the Invention

The present invention relates to a MOS half-bridge drive circuit, particularly for power MOS half-bridges.

2. Discussion of the Related Art

Power MOS half-bridges generally include a pair of power MOS transistors, usually N-channel type, push-pull connected as shown by way of example in FIG. 1. FIG. 1 shows a half-bridge 1 including two MOS (typically VDMOS-Vertical Double Diffused MOS) transistors $M_1$ and $M_2$. Transistor $M_1$ (top transistor) has its drain terminal connected to supply voltage VS, and its source terminal connected to the drain terminal of transistor $M_2$ (bottom transistor), the source terminal of which is grounded. The gate terminals of transistors $M_1$ and $M_2$ are connected respectively to top and bottom drivers T and B which, in turn, are connected to a synchronizing input signal IN, for producing drive signals. One of transistors $M_1$, $M_2$ is turned off when the other is on.

The output of half-bridge 1 thus presents a signal $V_{OUT}$, the amplitude of which switches between $R_{DSon2} * I$ (where $R_{DSon2}$ is the equivalent resistance between the drain and source of transistor $M_2$ when saturated, and I is the output current) and $V_s - R_{DSon1} * I$ (where $R_{DSon1}$ is the equivalent resistance between the drain and source of transistor $M_1$ when saturated).

In half-bridge 1, to achieve a low voltage drop in whichever of transistors $M_1$, $M_2$ is on at the time, and therefore a high excursion of output voltage $V_{OUT}$, the transistor must be driven by a high gate-source voltage (VGS), typically about 10 V, which provides for optimizing saturation resistance $R_{DSon}$.

Such a high voltage is usually achieved without difficulty with respect to transistor $M_2$, which permits the use of a reference voltage obtainable from the supply voltage. The situation is more complex, however, in the case of transistor $M_1$, which requires a drive voltage of $10 \text{ V} + V_{OUT}$, i.e. $10 \text{ V} + V_S - R_{DSon1} * I$, which is higher than the supply voltage.

A highly effective conventional solution to the problem is to use a charge-pump or voltage doubling circuit, which gives a voltage higher than the supply voltage, and provides for driving one or more half-bridges. A simplified diagram of such a circuit, indicated by reference character 2, is shown in FIG. 2.

Charge-pep circuit 2 includes an oscillator 3; two condensers 4 and 5; and two diodes 6 and 7. Oscillator 3 is connected to a reference voltage $V_{REF}$ and ground, so that its output 8 switches continually between $V_{REF}$ and 0 V. In the first half-cycle, when output 8 is 0 V, condenser 4 charges to $V_S$ via diode 6; whereas, in the second half-cycle, when output 8 equals $V_{REF}$, condenser 4 (whose terminal 9, not connected to oscillator 3, switches to voltage $V_{REF}+V_S$ in relation to ground) transfers the charge to condenser 5. In the second half-cycle, diode 6 disconnects condensers 4 and 5 from the supply voltage $V_S$, while, in the first half-cycle, in which condenser 4 restores the charge transferred to condenser 5, diode 7 disconnects condenser 5 from condenser 4 and the supply voltage $V_S$.

Under normal operating conditions, if $V_{CP}$ is the output voltage of circuit 2 (drive voltage), and $V_{be}$ the voltage drop in diodes 6 and 7:

$$V_{CP} = V_S - 2 i V_{be} + V_{REF} \quad (1)$$

and, assuming in this particular case that $V_{be} = 0.7V$ and $V_{REF} = 10$ V:

$$V_{CP} = V_S - 1.4V + 10 V \approx V_S + 9.6V$$

Charge-pump circuit 2 therefore provides a drive voltage ensuring a sufficient voltage drop $V_{GS}$ in transistor $M_1$ to effectively saturate it.

Reference voltage $V_{REF}$ is generally produced using circuit 10 in FIG. 3, which presents a minimum voltage difference $D_V$ between supply and reference voltages $V_S$ and $V_{REF}$. Circuit 10 includes a bipolar NPN transistor 11; a resistor 12 connected between the base and collector of transistor 11; and two diodes and 14, of which diode 13 is a Zener diode, connected in series between the base of transistor 11 and ground. The emitter of transistor 11 is connected to supply voltage $V_S$, and the base defines the output of circuit 10.

If R, in circuit 10, is the resistance of resistor 12; $h_{fe}$ the current gain for small signals of transistor 11; and $I_O$ the emitter current of transistor 11; when, as in this case, $V_S < V_Z + V_{be}$ (where $V_Z$ and $V_{be}$ are the voltage drop in Zener diode 13 and diode 14 respectively):

$$D_V = V_S - V_{REF} = (R * I_O)/h_{fe} + V_{be}$$

which, by appropriate sizing of the components, may be reduced to 1 V, so that:

$$V_{REF} = V_S - D_V = 1 V \quad (2)$$

There are some situations, however, in which the circuit shown in FIG. 3 is impractical, as in the case of automotive applications, which require that the MOS half-bridge, operating normally with a supply voltage $V_S$ of 6 V, should also be capable of operating with a minimum supply voltage $V_{Smin}$ of 5.4 V, i.e. that the drive circuit of top transistor $M_1$ supply an output voltage $V_{CP}$ of at least roughly 9.3 V.

In fact, to achieve a fairly good saturation resistance, $V_{DMOS}$ transistors must be driven in such a manner as to present a voltage drop $V_{GS}$ of at least 4 V. This is obtained easily, in the case of transistor $M_2$, even with a minimum supply voltage $V_{Smin}$. The same does not apply, however, to transistor $M_1$, which, with a minimum supply voltage $V_{Smin}$ of 5.4 V, requires that $V_{OUT} \approx 5.3$ V and, therefore, $V_{CP} \approx 9.3$ V.

According to equation (2), however, the circuit shown in FIG. 3 circuit provides, at most, supplying an output voltage $V_{REF}$ of 4.4 V, so that, according to equation (1), charge-pump circuit 2 provides solely for supplying a voltage $V_{CP}$ of:

$$V_{CP} = 5.4 \ V - 1.4 \ V + 4.4 \ V = 8.4 \ V$$

The source-drain voltage drop of transistor $M_1$ therefore equals:

$$V_{GS1} = V_{CP} - V_{OUT} = 3.1 \ V$$

which is well below the required value.

Another known solution for generating the reference voltage $V_{REF}$ includes using a PNP transistor in place of transistor 11, as shown in FIG. 4, where PNP transistor 15 has an emitter connected to supply voltage $V_S$, and a collector defining the output of the circuit. A resistor 16 is connected parallel to the base-emitter junction of transistor 15; a current source 17 is connected between the base of transistor 15 and ground; and a Zener diode 18 is connected between the output and ground.

The above solution, however, despite providing for a voltage drop $D_V = V_S - V_{REF}$ equal to the emitter-collector saturation voltage of transistor 15 (and, therefore, below that of the circuit shown in FIG. 3), is not used for the following reasons:

a) the maximum output current $I_{OUT}$ required by the load must be supplied at all times by transistor 15, even when not needed (thus resulting in high power consumption and dissipation); and b) for a given area, a PNP transistor provides for carrying a much smaller current than an NPN type, and the Zener diode must be sized to withstand all the current (thus increasing the size of the integrated circuit).

It is, therefore, an object of the present invention to provide a MOS half-bridge drive circuit enabling the half-bridges to operate even with a low supply voltage.

SUMMARY OF THE INVENTION

According to the present invention, there is provided a MOS half-bridge drive circuit, particularly for power MOS half-bridges, including a first reference voltage line set to a first reference voltage. A voltage generating circuit, coupled to the first reference voltage line, has an output including a second reference voltage line, and supplies a second reference voltage at its output. A voltage elevating circuit has first and second inputs coupled respectively to the first reference voltage line and the output of the voltage generating circuit, and has an output. The voltage elevating circuit supplies at its output a drive voltage greater than the first reference voltage and increasing with an increase in the second reference voltage. The voltage elevating circuit includes a feedback circuit increasing the second reference voltage to a maximum normal operating value in response to an increase in the drive voltage.

BRIEF DESCRIPTION OF THE DRAWINGS

A preferred, non-limiting embodiment of the present invention will be described by way of example with reference to the accompanying drawings, in which.

Figure 1:
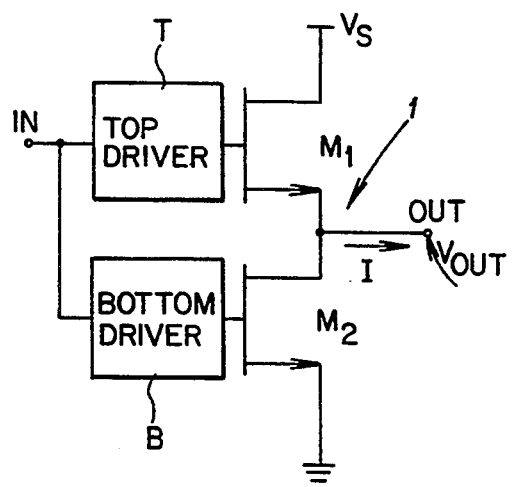
FIG. 1 shows a simplified diagram of a conventional MOS half-bridge for which the drive circuit according to the present invention is designed.
Figure 2:
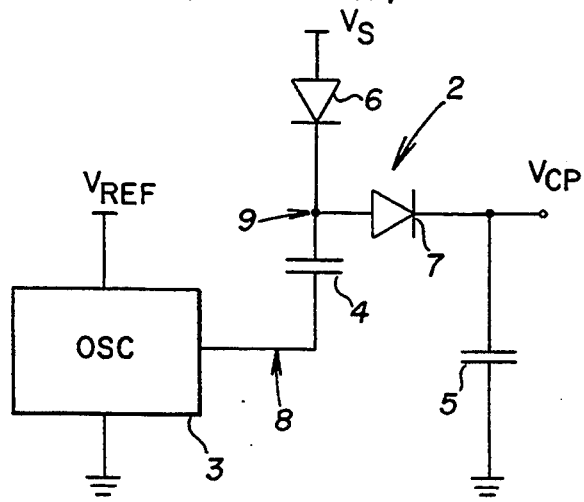
FIG. 2 shows a simplified electric diagram of a known charge-pump circuit.
Figure 3:
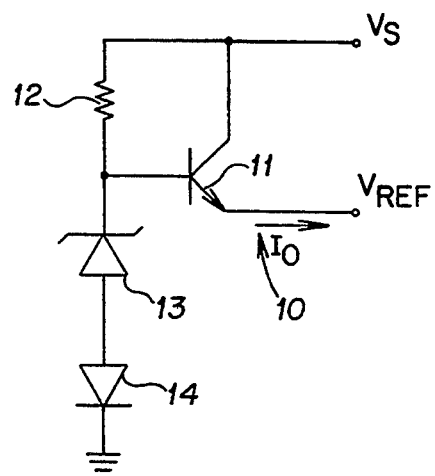
FIG. 3 shows an electric diagram of a known reference voltage source.
Figure 4:
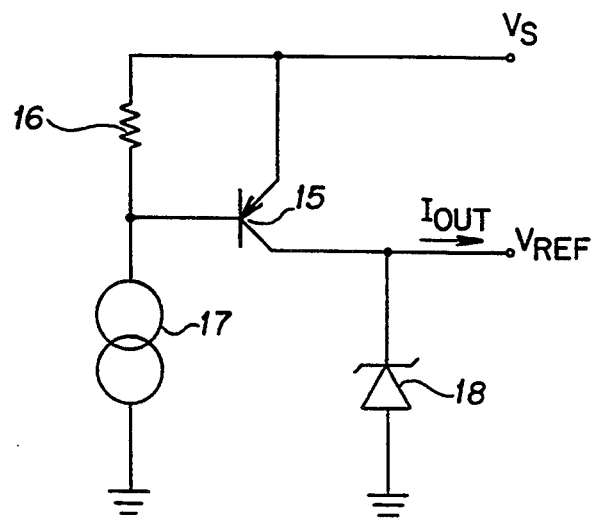
FIG. 4 shows an electric diagram of a further known reference voltage source.

No further description of FIGS. 1-4, which have already been described above, will be given herein after, and any component parts of the known circuits (in particular, the charge-pump in FIG. 2) forming part of the drive circuit, according to the present invention, will be indicated using the same reference characters.

Figure 5:
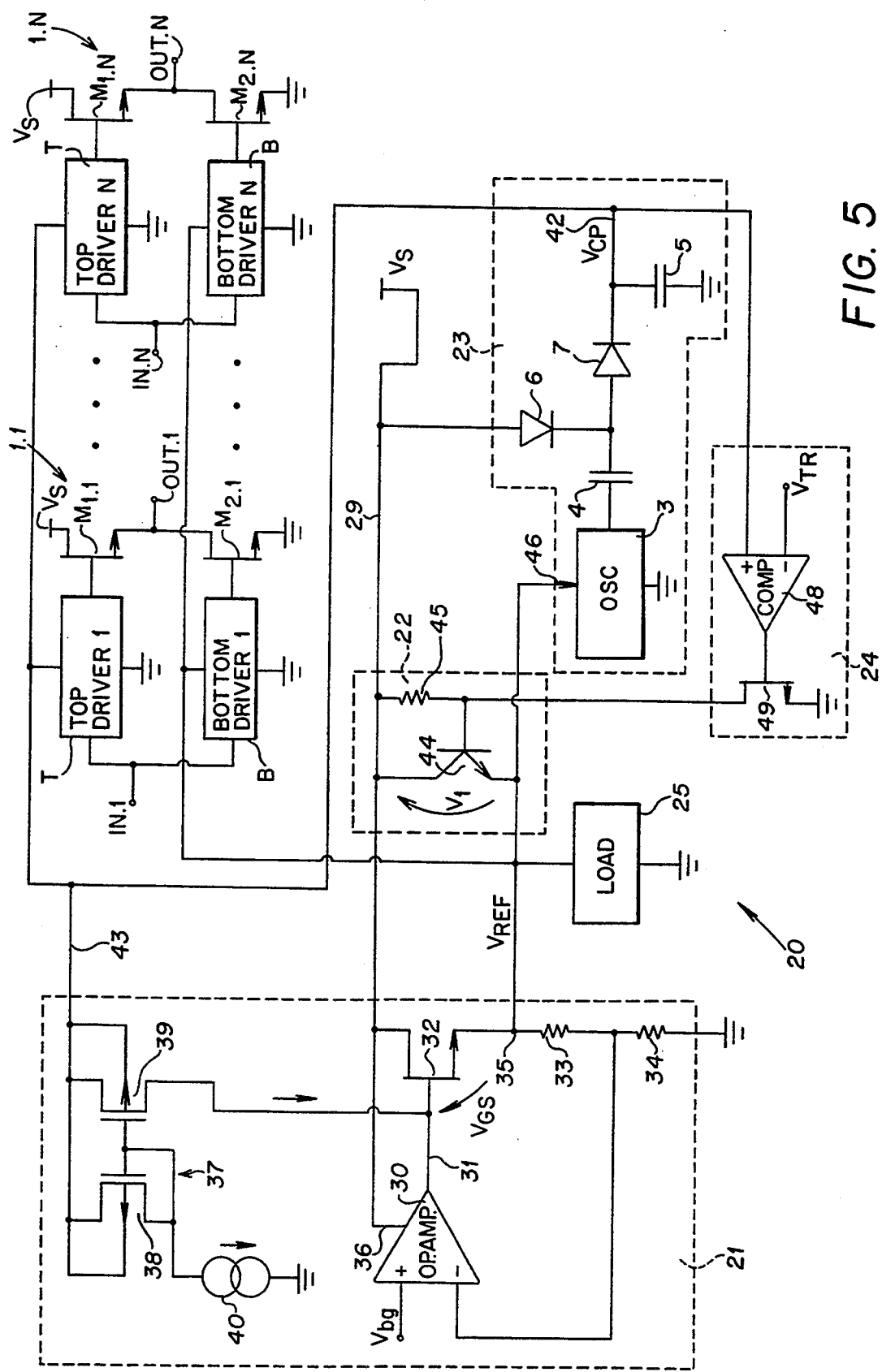
FIG. 5 shows a simplified electric diagram of the drive circuit according to the present invention.

Drive circuit 20 shown in FIG. 5 includes a linear voltage regulator 21; a firing circuit 22; a charge-pump circuit 23; a comparator stage 24; a load 25; a first group of bottom drivers B; and a second group of top drivers T.

Linear voltage regulator 21 (defining a voltage source) includes an operational amplifier 30, the output 31 of which is connected to the gate terminal of a preferably $V_{DMOS}$ transistor 32, the drain terminal of which is connected to supply line 29 (reference potential line on which voltage $V_S$ is present), and the source terminal of which is grounded via two series connected feedback resistors 33 and 34. The mid point between the source terminal of transistor 32 and resistor 33 defines output 35 of regulator 21 at which reference voltage $V_{REF}$ is present; while the mid point between feedback resistors 33 and 34 is connected to the inverting terminal of operational amplifier 30. The non-inverting terminal of operational amplifier 30 receives a precise, temperature-stable voltage $V_{bg}$ produced, for example, by a so-called band-gap circuit (not shown). Operational amplifier 30 also includes a supply input 36 connected to supply line 29. Regulator 21 also includes a current mirror circuit 37 comprising two P-channel MOS transistors 38 and 39. The gate and drain terminals of transistor 38 are shortcircuited and connected to a current source 40; while the drain terminal of transistor 39 is connected to output 31 of operational amplifier 30. The source terminals of both transistors 38 and 39 are connected to output 42 of charge-pump circuit 23 via line 43.

Firing circuit 22 includes a bipolar NPN transistor 44 having its collector connected directly to supply line 29, its base connected to supply line 29 via a resistor 45, and its emitter connected to output 35 of regulator 21 and to input 46 of oscillator 3 of charge-pump circuit 23. As in the circuit shown in FIG. 2, charge-pump circuit 23 (which forms a voltage elevating circuit) also includes a condenser (capacitor) 4 having one terminal connected to the output of oscillator 3, and the other terminal connected to the cathode of diode 6, the anode of which is connected to supply line 29. The cathode of diode 6 is also connected to the anode of diode 7, the cathode of which defines output 42 to which drive voltage $V_{CP}$ is supplied. Condenser 5 is disposed between output 42 and ground.

Comparator stage 24 (forming a switch mechanism for turning off firing circuit 22) in turn includes a comparator 48, the non-inverting input of which is connected to output 42 of charge-pump circuit 23, and the inverting input of which receives reference voltage $V_{TR}$. The output of comparator 48 is connected to the gate terminal of a MOS transistor 49, the source terminal of which is grounded, and the drain terminal of which is connected to the base of transistor 44 of firing circuit 22.

Load 25 and bottom drivers B are connected to output 35 of regulator 21, while top drivers T are connected to output 42 of charge-pump circuit 23. Bottom drivers B drive respective bottom transistors $M_{2.1}$-$M_{2.N}$ of half-bridges 1.1-1.N, by switching them according to the operating frequency of the half-bridges, receive respective synchronizing input signals $I_{N.1}$-$I_{N.N}$, which are also supplied to respective top drivers T for driving top transistors $M_{1.1}$-$M_{1.N}$ of the same half-bridges 1.1-1.N in the same way as, but in phase opposition to drivers B, and with a higher voltage, as already described. Top and bottom drivers T and B are also grounded, while the respective half-bridges 1.1-1.N provide outputs $OUT_1$-$OUT_N$.

The FIG. 5 drive circuit operates as follows.

With a supply voltage $V_S$ of 5.4 V on line 29, the firing circuit is designed to give a voltage drop $V_1$ of 1 V, so that $V_{REF}=4.4$ V.

In the above condition, oscillator 46 of charge-pump circuit 23 comes into operation, and, on the basis of equation (1), charge-pump circuit 23 supplies an operating output voltage of:

$$V_{CP}=V_S+V_{REF}-2\,V_{be}=5.4+4.4-1.4=8.4\text{ V}.$$

The above voltage $V_{CP}$ is supplied to current mirror circuit 37, which then drives transistor 32 by bringing its gate terminal up to voltage $V_{CP}$. Transistor 32 therefore provides a voltage drop $V_{GS}$ (overdrive) of:

$$V_{GS}=8.4-4.4=4\text{ V}.$$

This is sufficient to saturate transistor 32, so that voltage $V_{REF}$ begins to rise, thus resulting, on the basis of equation (1), in a corresponding increase in voltage $V_{CP}$, and a further increase in voltage $V_{REF}$. A positive reaction is thus initiated, which continues until transistor 32 is fully saturated and (assuming a 100 mV drain-source saturation voltage $V_{DSsat}$ of transistor 32) reference voltage $V_{REF}$ reaches the maximum value $$V_{REF}=5.4\,V-100\,mV=5.3\,V$$

and $$V_{CP}=5.4+5.3-1.4=9.3\,V.$$

Prior to reaching the normal operating condition, the reduction in the difference between $V_S$ and $V_{REF}$ is also accompanied by a reduction in the voltage drop at the base-emitter junction of transistor 44 of firing circuit 22, until transistor 44 eventually goes off.

Under normal operating conditions, top and bottom drivers T and B function correctly, by virtue of the gate-source junction being supplied with a voltage $V_{GS}$ of at least 4 V.

In actuality, the positive reaction, and therefore operation of the drivers and respective half-bridges, is also initiated at lower supply voltages ($V_S=4$ V), even though the equivalent drain-source saturation resistance is less than optimum.

Firing circuit 22 is also turned off by comparator stage 24, especially in the presence of a high supply voltage $V_S$ (which may be as high as 60 V), and, in particular, when the output voltage $V_{CP}$ of charge-pump circuit 23 is such as to ensure the system is turned on, and prior to output voltage $V_{REF}$ of regulator 21 reaching the normal operating value. In fact, as soon as drive voltage $V_{CP}$ exceeds voltage $V_{TR}$ at the inverting input of comparator 48, the output of comparator 48 switches from low to high, thus turning on transistor 49, and the voltage at the drain terminal of transistor 49 becomes low, thus inversely biasing the base-emitter junction of transistor 44.

Consequently, even in the presence of a high supply voltage $V_S$, output voltage $V_{REF}$ of regulator 21, on reaching the set value, maintains this value by virtue of being independent of supply voltage $V_S$. A further advantage of actively turning off firing circuit 22 (by connecting the base terminal of transistor 44 to a voltage close to 0 V) is that it enables transistor 44 to withstand a breakdown voltage $BV_{CBO}$.

As supply voltage $V_S$ increases beyond the value at which transistor 32 is no longer saturated, operational amplifier 30, which, with a low supply voltage $V_S$, is incapable of supplying $V_{REF}$, provides a precise, temperature-stable, regulated reference output voltage:

$$V_{REF}=V_{bg}(1+R_2/R_1)$$

where $R_2$ and $R_1$ are the respective resistances of resistors 33 and 34. By appropriate sizing, it is therefore possible to obtain an optimum voltage $V_{REF}$ of 10 V.

The advantages of the circuit shown in FIG. 5 will be clear from the foregoing description. In addition to providing for turning on and driving one or more MOS half-bridges, even in the presence of a low supply voltage of 5.4 V, the circuit according to the present invention also provides for generating an optimum reference voltage, e.g. of 10 V, as required for driving MOS half-bridges in the best possible manner. The circuit is also straightforward in design, and is easily implementable, for example, as an integrated circuit.

To those skilled in the art it will be clear that changes may be made to the circuit as described and illustrated herein without, however, departing from the scope of the present invention. In particular, should firing circuit 22 be insufficient for supplying the current required, it may be replaced by circuit 22' shown in FIG. 6.

In place of one transistor 44, circuit 22' features two transistors: a PNP transistor 53 with its emitter terminal connected to supply line 29, its base terminal connected to one terminal of resistor 45 and to the drain terminal of transistor 49 of comparator stage 24, and its collector terminal connected to the base terminal of a second NPN transistor 54, the collector terminal of which is connected to supply line 29, and the emitter terminal of which is connected to output 35 of regulator 21. Finally, a current source 55, supplying current $I_1$, is provided between the base terminal of transistor 53 and ground.

Figure 6:
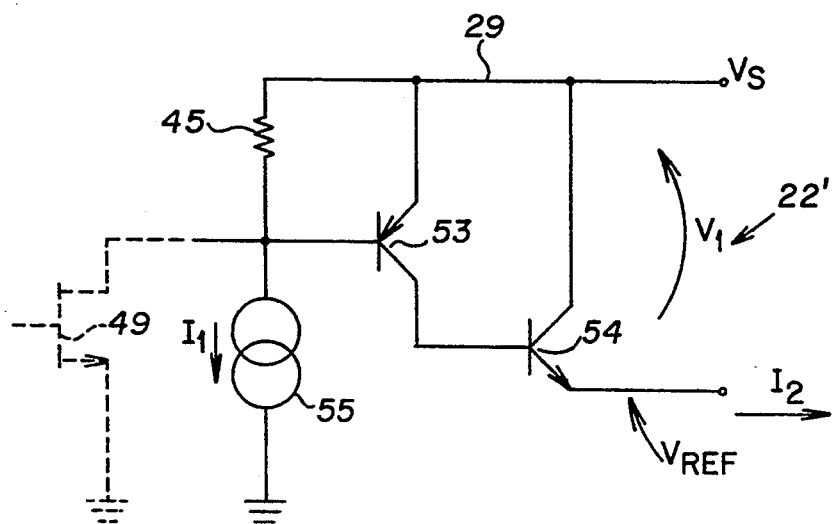
FIG. 6 shows an alternate embodiment electric diagram according to the present invention.

The FIG. 6 circuit also provides a voltage drop $V_1=V_S-V_{REF}=1$ V, but, in comparison with circuit 22, a much higher output current $I_2$ equal to:

$$I_2=\beta_1\cdot\beta_2\cdot I_1$$

where $\beta_1$ and $\beta_2$ are the current gain of transistors 53 and 54 respectively.

We claim:
1. A MOS half-bridge drive circuit comprising:
a first reference voltage line set to a first reference voltage;
a second reference voltage line;
a voltage generating circuit, coupled to the first reference voltage line, having an output coupled to the second reference voltage line, supplying a second reference voltage at its output; and
a voltage elevating circuit having a first and second input coupled respectively to the first reference voltage line and the output of the voltage generating circuit, and having an output, and supplying at its output a drive voltage greater than the first reference voltage and increasing with an increase in the second reference voltage;
wherein the voltage elevating circuit includes a feedback circuit increasing the second reference volt- age to a maximum normal operating value in response to an increase in the drive voltage.

2. A drive circuit as claimed in claim 1 wherein the voltage generating circuit further includes a voltage regulator having an input coupled to the output of the voltage elevating circuit.

3. A drive circuit as claimed in claim 2 wherein the voltage regulator includes an output transistor having a control terminal coupled to the output of the voltage elevating circuit, and an output terminal, the output of the voltage generating circuit being provided on the output terminal.

4. A drive circuit as claimed in claim 3 wherein the output transistor includes a MOS transistor having a gate terminal coupled to the output of the voltage elevating circuit, a source terminal including the output terminal of the voltage generating circuit, and a drain terminal connected to the first reference voltage line.

5. A drive circuit as claimed in claim 4 further comprising:
a third reference voltage line receiving a third reference voltage; and
a resistive feedback;
wherein the voltage regulator includes an operational amplifier having a non-inverting input coupled to the third reference voltage line, an inverting input coupled to the output terminal of the voltage generating circuit through the resistive feedback circuit, and an output coupled to the control terminal of the output transistor.

6. A drive circuit as claimed in claim 5 further comprising a current mirror circuit coupled to the control terminal of the output transistor and the output of the voltage elevating circuit.

7. A drive circuit as claimed in claim 6 further comprising a firing circuit coupled to the first reference voltage line and the second input of the voltage elevating circuit.

8. A drive circuit as claimed in claim 7 wherein the firing circuit includes a transistor having a first terminal coupled to the first reference voltage line, a second control terminal coupled to the first reference voltage line, and a third terminal coupled to the second input of the voltage elevating circuit.

9. A drive circuit as claimed in claim 8 wherein the transistor of the firing circuit includes a bipolar transistor.

10. A drive circuit as claimed in claim 8 wherein the transistor of the firing circuit includes two cascade-connected bipolar transistors.

11. A drive circuit as claimed in claim 10 further comprising a switch coupled to the control terminal of the transistor of the firing circuit, turning off the firing circuit prior to the drive circuit reaching a normal operating condition.

12. A drive circuit as claimed in claim 11 wherein the switch circuit includes a comparator stage having a first input coupled to the output of the voltage elevating circuit, a second input coupled to a threshold potential, and an output coupled to the control terminal of the transistor of the firing circuit.

13. A drive circuit as claimed in claim 1 wherein the voltage elevating circuit includes a charge-pump circuit.

14. A drive circuit as claimed in claim 13 wherein the charge-pump circuit includes:
first and second capacitors, the first capacitor having a first terminal and a second terminal;

first and second diodes; and
an oscillator stage coupled to the output of the voltage generating circuit, and an output coupled to the first terminal of the first capacitor, the second terminal of the first capacitor coupled to the first reference voltage line through the first diode and coupled to the output of the voltage elevating circuit through the second diode, the second capacitor coupled to the output of the voltage elevating circuit and a third reference voltage line.

15. A MOS half-bridge drive circuit comprising:
a first reference voltage line set to a first reference voltage;
a second reference voltage line;
a voltage generating circuit, couples to the first reference voltage line and the second reference voltage line, supplying a second reference voltage on the second reference voltage line; and
a voltage elevating circuit having a first input coupled to the first reference voltage line and a second input coupled to the second reference voltage line and an output, and supplying at its output a drive voltage greater than the first reference voltage and increasing with an increase in the second reference voltage, the voltage elevating circuit includes a feedback path increasing the second reference voltage to a maximum normal operating value in response to an increase in the drive voltage.

16. A drive circuit as claimed in claim 15 wherein the voltage generating circuit further includes a voltage regulator having an input coupled to the output of the voltage elevating circuit.

17. A drive circuit as claimed in claim 16 wherein the voltage regulator includes an output transistor having a control terminal coupled to the output of the voltage elevating circuit, and an output terminal including the output of the voltage generating circuit.

18. A drive circuit as claimed in claim 17 wherein the output transistor includes a MOS transistor having a gate terminal coupled to the output of the voltage elevating circuit, a source terminal including the output terminal of the voltage generating circuit, and a drain terminal connected to the first reference voltage line.

19. A drive circuit as claimed in claim 18 further comprising:
a third reference voltage line receiving a third reference voltage; and
a resistive feedback circuit;
the voltage regulator includes an operational amplifier having a non-inverting input coupled to the third reference voltage line, an inverting input coupled to the output terminal of the voltage generating circuits through the resistive feedback circuit, and an output coupled to the control terminal of the output transistor.

20. A drive circuit as claimed in claim 19 further comprising a current mirror circuit coupled to the control terminal of the output circuit and the output of the voltage elevating circuit.

21. A drive circuit as claimed in claim 20 further comprising a firing circuit coupled to the first reference voltage line and the second input of the voltage elevating circuit.

22. A drive circuit as claimed in claim 21 wherein the firing circuit includes a transistor having a first terminal coupled to the first reference voltage line, a second control terminal coupled to the first reference voltage line, and a third terminal coupled to the second input of the voltage elevating circuit.

23. A drive circuit as claimed in claim 22 wherein the transistor of the firing circuit includes a bipolar transistor.

24. A drive circuit as claimed in claim 23 wherein the transistor of the firing circuit includes two cascade-connected bipolar transistors.

25. A drive circuit as claimed in claim 24 further comprising a switch coupled to the control terminal of the transistor of the firing circuit, turning off the firing circuit prior to the drive circuit reaching a normal operating condition.

26. A drive circuit as claimed in claim 25 wherein the switch circuit includes a comparator stage having a first input coupled to the output of the voltage elevating circuit, a second input coupled to a threshold potential, and an output coupled to the control terminal of the transistor of the firing circuit.

27. A drive circuit as claimed in any one of claims 17–26 wherein the voltage elevating circuit includes a charge-pump circuit.

28. A drive circuit as claimed in claim 27 wherein the charge-pump circuit includes:
first and second capacitors, the first capacitor having a first terminal and a second terminal;
first and second diodes; and
an oscillator stage coupled to the output of the voltage generating circuit, and an output coupled to the first terminal of the first capacitor, the second terminal of the first capacitor coupled to the first reference voltage line through the first diode and coupled to the output of the voltage elevating circuit through the second diode, the second capacitor coupled to the output of the voltage elevating circuit and a fourth reference voltage line.

29. A MOS half-bridge drive circuit comprising:
first means for receiving a first reference voltage;
means, coupled to the first means for receiving, for supplying a second reference voltage; and
second means for receiving the second reference voltage;
means, coupled to the first and second means for receiving, for supplying a drive voltage greater than the first reference voltage that increases with an increase in the second reference voltage;
means for supplying feedback including means for coupling the drive voltage the means for supplying the second reference voltage.

30. A method for driving a MOS half-bridge circuit comprising the steps of:
supplying a first reference voltage line with a first reference voltage;
supplying, in response to the first reference voltage, a second reference voltage line with a second reference voltage;
generating, in response to the first and second reference voltages, a drive voltage greater than the first reference voltage that increases with an increase in the second reference voltage; and
increasing the second reference voltage to a maximum normal operating value in response to an increase in the drive voltage.

* * * * *

UNITED STATES PATENT AND TRADEMARK OFFICE
CERTIFICATE OF CORRECTION

PATENT NO. : 5,376,832
DATED : December 27, 1994
INVENTOR(S) : Gariboldi et al.

It is certified that error appears in the above-indentified patent and that said Letters Patent is hereby corrected as shown below:

Please change column 2, equation (2)

from "$V_{REF} = V_S - D_V = 1V$" to

--$V_{REF} = V_S - D_V = V_S - 1V$--.

Signed and Sealed this

Fifth Day of December, 1995

Attest:

BRUCE LEHMAN

*Attesting Officer*  *Commissioner of Patents and Trademarks*